United States Patent
Ho et al.

(10) Patent No.: US 7,465,664 B2
(45) Date of Patent: Dec. 16, 2008

(54) METHOD FOR FABRICATING SEMICONDUCTOR DEVICE TO LOWER SOURCE/DRAIN SHEET RESISTANCE

(75) Inventors: Ching-Yuan Ho, Hsinchu (TW); Chen-Hsin Lien, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 248 days.

(21) Appl. No.: 11/408,940

(22) Filed: Apr. 24, 2006

(65) Prior Publication Data

US 2007/0155074 A1     Jul. 5, 2007

(30) Foreign Application Priority Data

Dec. 30, 2005    (TW) ............................... 94147536 A

(51) Int. Cl.
*H01L 21/44*    (2006.01)
*H01L 23/52*    (2006.01)

(52) U.S. Cl. ........................ 438/682; 257/754
(58) Field of Classification Search ................ 438/675, 438/682, 644, 654; 257/751–757
See application file for complete search history.

(56) References Cited

U.S. PATENT DOCUMENTS

| | | | |
|---|---|---|---|
| 5,010,032 A | 4/1991 | Tang et al. | |
| 5,302,539 A * | 4/1994 | Haken et al. | 438/228 |
| 5,612,253 A | 3/1997 | Farahani et al. | |
| 6,410,429 B1 | 6/2002 | Ho et al. | |
| 6,521,956 B1 * | 2/2003 | Lee | 257/384 |
| 6,784,466 B2 * | 8/2004 | Chu et al. | 257/194 |
| 6,972,250 B2 * | 12/2005 | Cabral et al. | 438/618 |
| 6,982,474 B2 * | 1/2006 | Currie et al. | 257/616 |

* cited by examiner

*Primary Examiner*—Calvin Lee
(74) *Attorney, Agent, or Firm*—Rabin & Berdo, P.C.

(57) ABSTRACT

A method for fabricating a semiconductor device to lower source/drain sheet resistance is provided. A dielectric layer with a plurality of contact windows is formed on a semiconductor device. Next, selective epitaxial growth (SEG) is implemented, and then a metal layer is sputtered. After that, a silicide is formed by heat treatment. In another embodiment, selective epitaxial growth is implemented first, and then a dielectric layer with a plurality of contact windows is formed. Then, a metal layer is sputtered, and a silicide is then formed by heat treatment. Since the silicide is formed by way of SEG, the silicon substrate will not be consumed during the process of forming the silicide, and the depth of the junction region is maintained, and the source/drain sheet resistance is lowered.

16 Claims, 6 Drawing Sheets

METHOD FOR FABRICATING SEMICONDUCTOR DEVICE TO LOWER SOURCE/DRAIN SHEET RESISTANCE

This Non-provisional application claims priority under 35 U.S.C. § 119(a) on Patent Application No(s). 094147536 filed in Taiwan, R.O.C. on Dec. 30, 2005, the entire contents of which are hereby incorporated by reference.

BACKGROUND OF THE INVENTION

1. Field of Invention

The present invention relates to a method for fabricating a semiconductor device, and more particularly to a method for fabricating a semiconductor device, wherein a silicide is formed to lower the source/drain sheet resistance.

2. Related Art

Due to ever-increasing device density and ever-decreasing device dimensions in accordance with Moore's Law, design and research/development of super-sized integrated circuits encounters many complicated technical problems, such as RC delay, gate leakage current, poly depletion, and gate resistance.

Moreover, the resistances (Rc, Rch, Rov, or source/drain series resistance Rsd etc.) considered in the design of a metal oxide silicon field effect transistor (MOSFET) vary significantly with device dimensions, wherein a graded doping profile with high resistance is generated due to well implant engineering and thermal budget. Further, due to dimension scaling, the area of the contact window is reduced, and Rc is increased accordingly. However, as the dimensions are reduced, it is also very important to take the source/drain sheet resistance into consideration in addition to the above resistances.

For example, U.S. Pat. No. 5,612,253 discloses a related art, wherein the contact windows are etched; next, a Ti metal layer is sputtered; then, nitrogen gas is fed into an annealing furnace; and three annealing control steps are conducted, such that Ti and the substrate react to generate a silicide. The silicide layer is used to lower the contact window resistance. However, as the substrate is consumed during the process of forming the silicide layer, the source/drain sheet resistance (Rcsd) is increased. Moreover, the surface of the Ti metal layer and the nitrogen gas contact and react with each other, so as to generate TiN to function as a barrier layer, thus preventing the $WF_4$ and Ti from reacting to form a volcano effect when the metal is filled into the contact windows.

Referring to FIGS. 1 and 2, they are partial cross-sectional view of a semiconductor device according to another prior art. The semiconductor device is, for example, a metal oxide semiconductor (MOS) formed on a silicon substrate 11. The silicon substrate 11 has a gate region 12 and two junction regions 13, 14. An oxide layer 121 is further formed between the gate region 12 and the silicon substrate 11. With selective epitaxial growth (SEG) technology, a silicon layer or SiGe epitaxial layer 15 is grown on the gate region 12 and two junction regions 13, 14.

Further, a metal layer 16 is deposited by sputtering to cover the gate region 12 and the two junction regions 13, 14. Then, rapid thermal annealing process (RTP) is conducted to convert the silicon or SiGe expitaxy grown on the gate region 12 and the two junction regions 13, 14 into a silicide 17.

With the reduction of device dimensions, the proportion of the source/drain sheet resistance in the series resistance of the whole device becomes higher and higher. Therefore, due to the reduction of device dimensions, the source/drain sheet resistance has gradually become an urgent technical problem to be solved.

SUMMARY OF THE INVENTION

To solve the problem of high source/drain sheet resistance without affecting the well implant engineering, the present invention discloses a method for fabricating a semiconductor device, wherein a silicide is formed to lower the source/drain sheet resistance. Through the SEG technique, a silicide is grown in a nitrogen-contained environment, so as to lower the source/drain sheet resistance.

According to the embodiments of the present invention, the method for fabricating a semiconductor device to lower the source/drain sheet resistance disclosed by the present invention may reduce the power consumption, increase the adhesion between copper wires and the dielectric layer, and increase the processing speed.

The above illustration of the content of the present invention and the following descriptions of the embodiments are intended to demonstrate and explain the spirits and principle of the present invention, and an explanation of the claims of the present invention is further provided.

Further scope of applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

The detailed features and advantages of the present invention are discussed in detail in the following embodiments. Those skilled in the related arts can easily understand the technical content of the present invention, and can implement it accordingly. Furthermore, the objects and advantages of the present invention will be apparent to those skilled in the related arts according to the content of the specification, claims, and drawings.

The process of the method for fabricating a semiconductor device of the present invention is described below in detail. The sequence of the steps is not fixed or indispensable. Some steps can be implemented at the same time, and can be skipped or added. The fabricating steps are used to illustrate the characteristics of the process of the present invention in a broad and simple way, and they are not intended to limit the sequence or the number of the steps in the fabricating method of the present invention.

Referring to FIGS. 3 to 7, the present invention mainly directs to lower the source/drain sheet resistance and form a barrier layer (TiN) during the process of forming the silicide.

Figure 1:
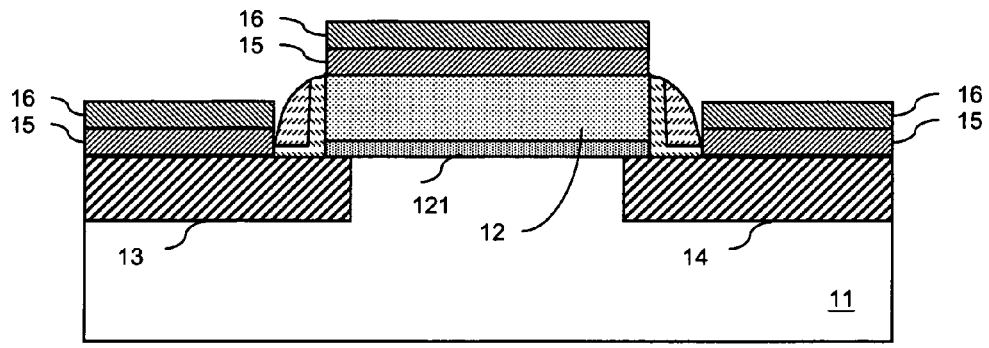
FIGS. 1 and 2 show the manufacturing steps of the method for fabricating the semiconductor device in the prior art.
Figure 2:
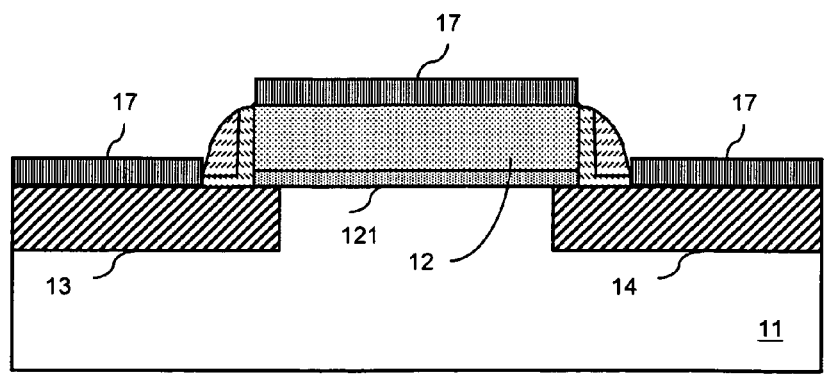
Figure 3:
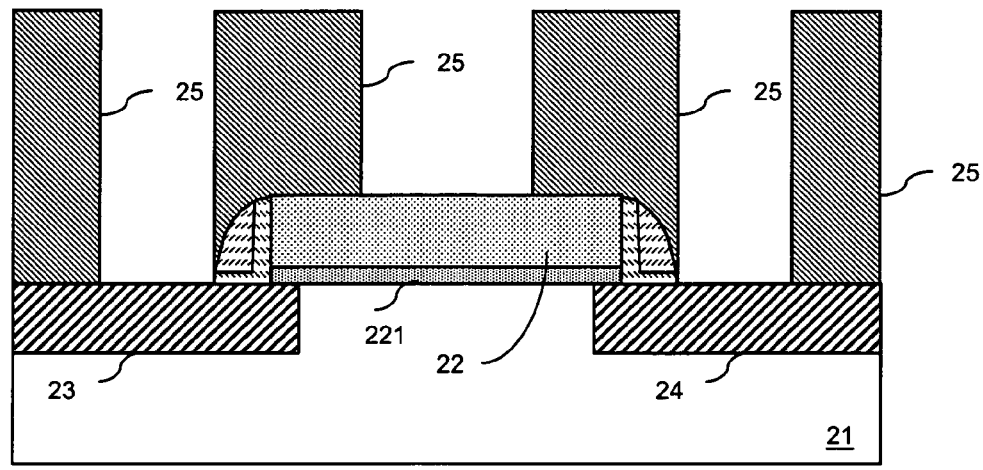
FIGS. 3 to 7 show the manufacturing steps of the method for fabricating the semiconductor device according to one embodiment of the present invention.

As shown in FIG. 3, it shows a partial cross-sectional view of a semiconductor device. The semiconductor device in the figure is, for example, a MOS device formed on a silicon substrate 21. The silicon substrate 21 is provided with a gate region 22 and two junction regions 23, 24. In FIG. 3, a dielectric layer 25 with a plurality of contact windows is formed, wherein the contact windows are formed by a photolithography process. After forming the contact windows, the gate region 22 and the two junction regions 23, 24 are exposed. The junction regions 23, 24 are implanted into the silicon substrate 21 by ion implantation, wherein the impurity characteristic of the ions implanted in the junction regions 23, 24 is opposite to that of the silicon substrate 21. For example, if the silicon substrate is of P-type, the junction regions are of N-type; otherwise, if the silicon substrate is of N-type, the junction regions are of P-type. Then, an oxide layer 221 is further formed between the gate region 22 and the silicon substrate 21, for example, MOS; and the junction regions 23, 24 function as the source/drain region.

Figure 4:
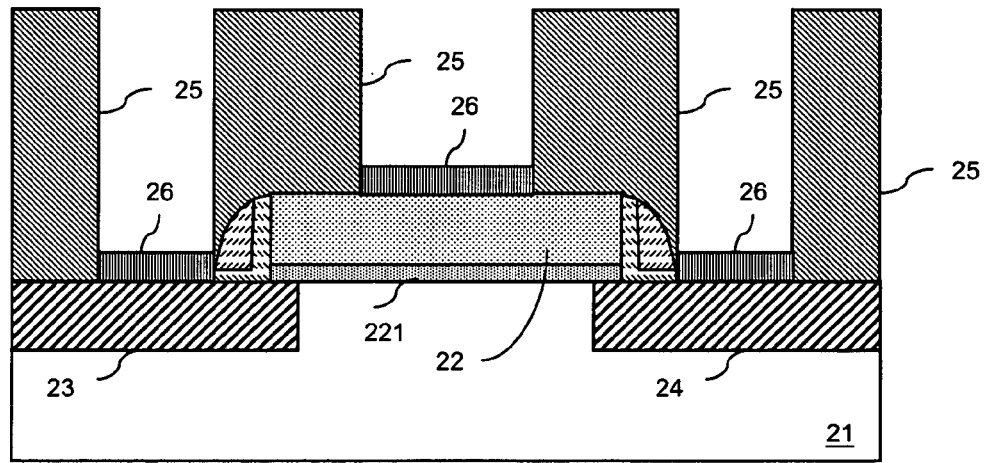

Then, as shown in FIG. 4, a silicon layer or SiGe epitaxial layer 26 is grown on the gate region 22 and the two junction regions 23, 24 through the technique of SEG.

Figure 5:
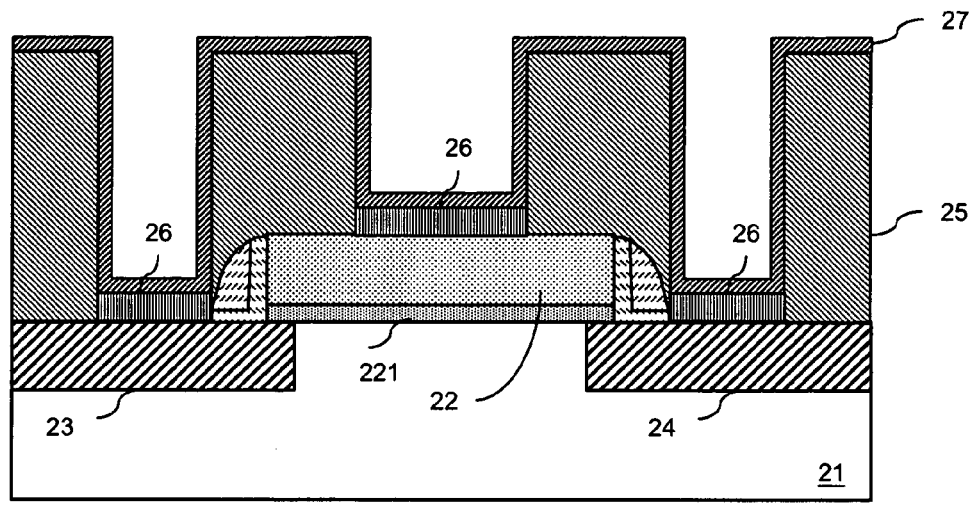

As shown in FIG. 5, a metal layer 27 is then deposited by sputtering to cover the gate region 22, the two junction regions 23, 24, and the rest of the dielectric layer 25. The metal layer 27 may be Ti, Co, or Ni. Afterward, through RTP, the silicon or SiGe expitaxy grown on the gate region 22 and the two junction regions 23, 24 is converted into a silicide in an $N_2$ environment.

Figure 6:
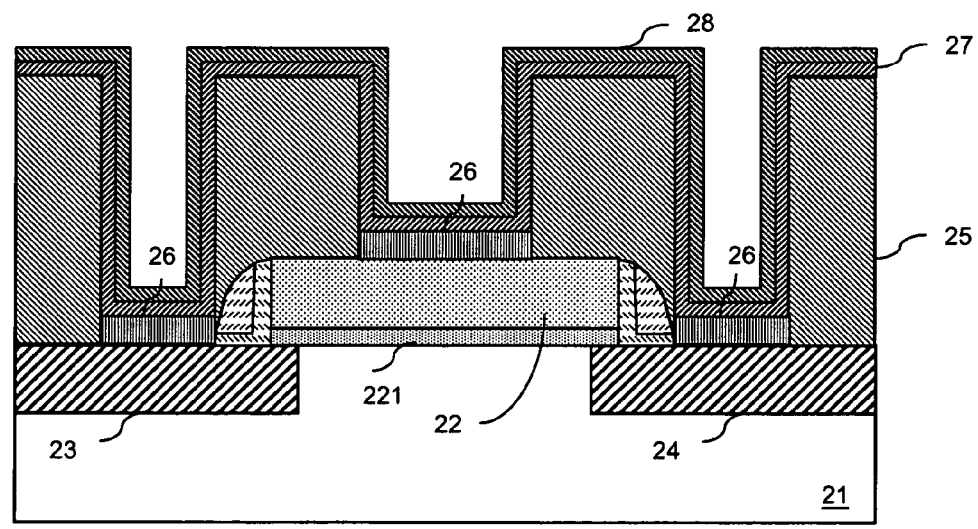

As shown in FIG. 6, TiN as a barrier layer 28 is finally formed in following two different ways. One is generating TiN by nitridation, and the other is depositing TiN by reactive sputtering. Using TiN as the barrier layer 28 can prevent the copper ions of different metal layers from diffusing into the silicon substrate and meanwhile increase the adhesion between copper wires and the dielectric layer.

As for Nitridation, Ti of certain thickness is first deposited onto the surface of the chip by direct current (DC) magnetron sputtering. Then, the chip is treated under high temperature in a $N_2$ or $NH_3$-contained environment, such that the Ti metal layer is azotized into TiN. A RTP can be used to azotize Ti, in order to reduce the thermal budget of nitridation and ensure the shallow junction between the contact metal and the device.

As for the reactive sputtering, TiN is formed by Ti and N, and is deposited onto the surface of the chip, wherein Ti is sputtered by ion bombardment, with a Ti layer as the target material and with a mixed gas of argon and nitrogen as the reacting gas; N is formed by dissociation reaction in the plasma. Usually, the TiN used as a barrier layer is approximately 50 to 150 nm thick. The pressure controlled by the DC sputtering and reactive sputtering is approximately several m Torr to 100 m Torr.

Figure 7:
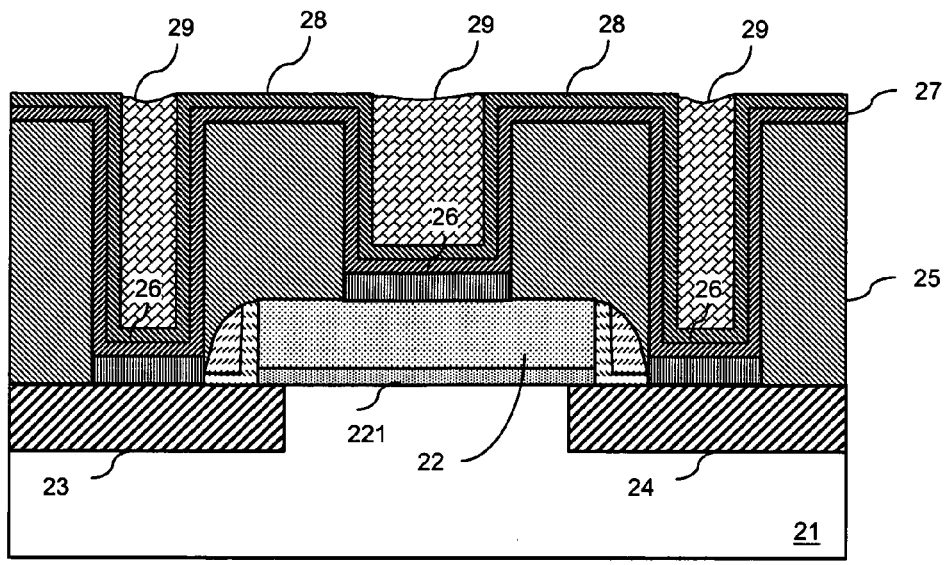

Finally, metal plugs 29 are formed, as shown in FIG. 7, which are made of metal materials such as tungsten.

Referring to FIGS. 8 to 12, they show the manufacturing steps of the method for fabricating the semiconductor device according to another embodiment of the present invention.

Figure 8:
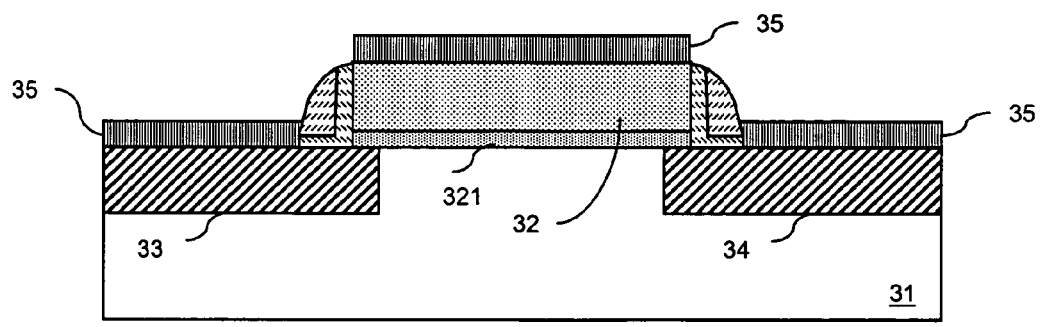
FIGS. 8 to 12 show the manufacturing steps of the method for fabricating the semiconductor device according to another embodiment of the present invention.

As shown in FIG. 8, it shows a partial cross-sectional view of a semiconductor device. The semiconductor device in the figure is, for example, a MOS device formed on a silicon substrate 31. The silicon substrate 31 is provided with a gate region 32 and two junction regions 33, 34. The junction regions 33, 34 are implanted into the silicon substrate 31 by ion implantation, wherein the impurity characteristic of the ions implanted in the junction regions 33, 34 is opposite to that of the silicon substrate 31. For example, if the silicon substrate is of P-type, the junction regions are of N-type; otherwise, if the silicon substrate is of N-type, the junction regions are of P-type. An oxide layer 321 is further formed between the gate region 32 and the silicon substrate 31, for example, MOS; and the junction regions 33, 34 function as the source/drain region. In FIG. 8, through the technique of SEG, a silicon layer or SiGe epitaxial layer 35 is grown on the gate region 32 and the two junction regions 33, 34.

Figure 9:
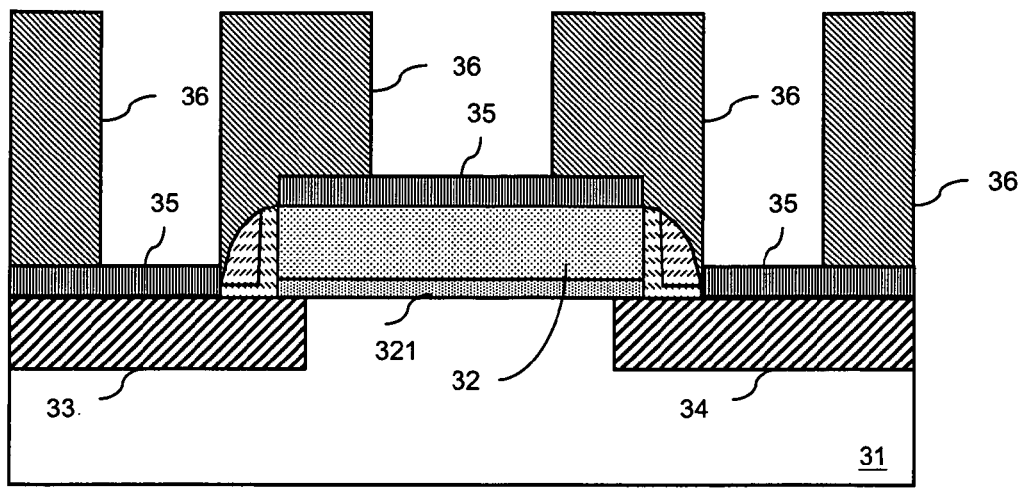

As shown in FIG. 9, a dielectric layer 36 with a plurality of contact windows is formed, wherein the contact windows are formed by a photolithography process.

Figure 10:
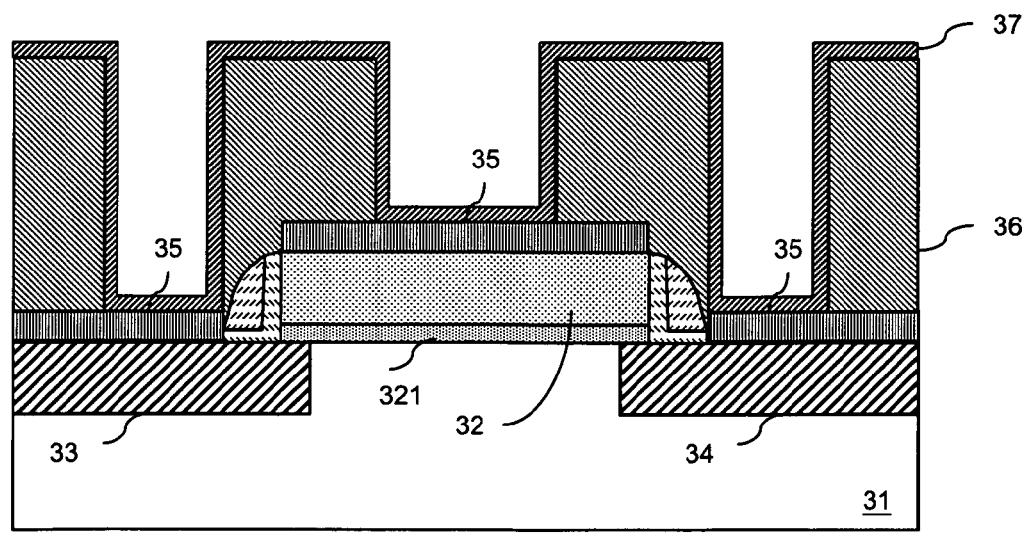
Figure 11:
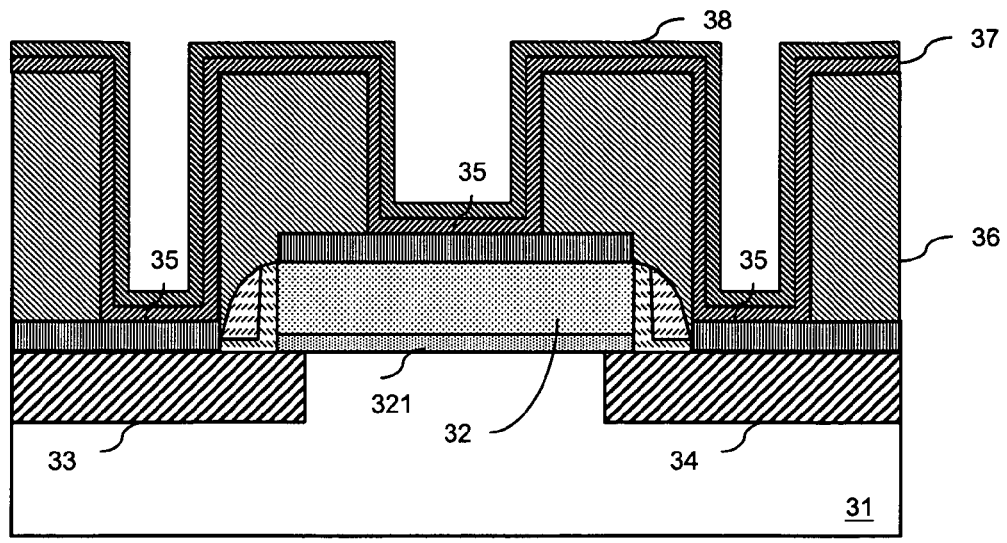
Figure 12:
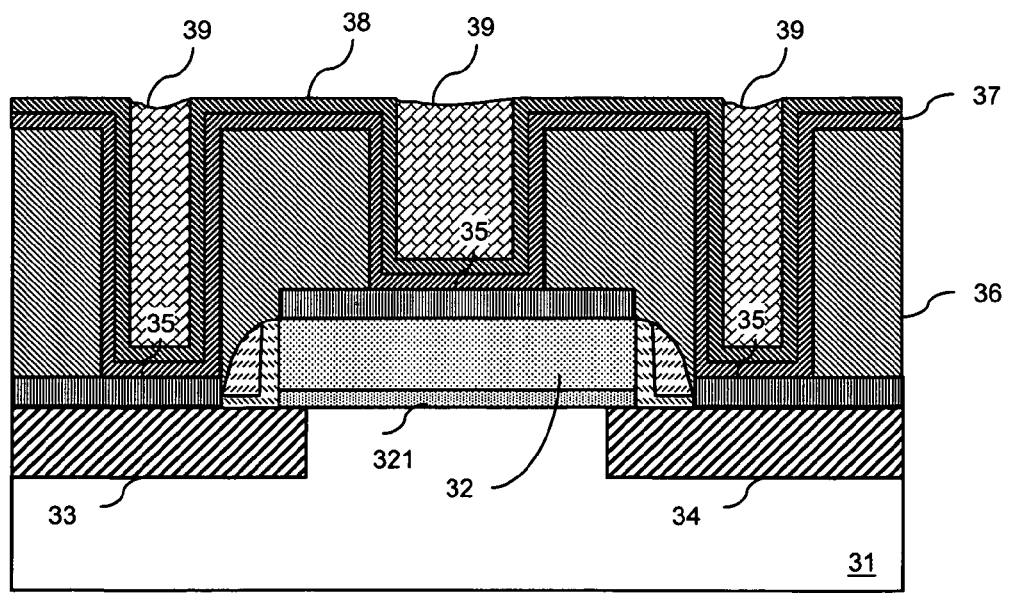

As shown in FIG. 10, a metal layer 37 is deposited by sputtering to cover the gate region 32, the two junction regions 33, 34, and the rest of the dielectric layer 36. The metal layer 37 may be Ti, Co, or Ni. Afterward, the silicon or the SiGe expitaxy grown on the gate region 32 and the two junction regions 33, 34 is converted into a silicide through RTP in an $N_2$ environment. As shown in FIG. 11, TiN as a barrier layer 38 is then formed, and the fabricating manner is similar to that of the foregoing embodiment, and which thus will not be described in detail herein. Finally, a metal plug 39 is formed, as shown in FIG. 12, which is made of materials such as tungsten.

According to the embodiments of the present invention, the method for fabricating a semiconductor device to lower the source/drain sheet resistance of the present invention will not consume the silicon substrate during the process of forming the silicide. The present invention mainly uses the technique of SEG to form a silicon layer or SiGe layer as a sacrificial layer, and the sacrificial layer and Ti are reacted to form a silicide; therefore, the silicon substrate will not be consumed.

In general, the source/drain sheet resistance is inversely proportional to its depth in the substrate, so the smaller its depth is, the larger its resistance will be, since the silicon substrate is consumed during the process of forming the silicide. At present, under the technical problem that the source/drain sheet resistance takes an ever-increasing proportion in the MOSFET series resistance, the present invention mainly uses SEG to form a silicide in a nitrogen-contained environment. Therefore, the silicon substrate on the junction regions will not be consumed during the process of forming the silicide, such that the depth of the junction region can be maintained, and the source/drain sheet resistance will not be increased due to the reduction in the depth of the junction region.

The method for fabricating the semiconductor device to lower the source/drain sheet resistance of the present invention can be used to lower the source/drain sheet resistance and meanwhile form a contact window barrier layer, thereby significantly improving the specific functions of the device and reducing the processing time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor device to lower source/drain sheet resistance, comprising:

providing a semiconductor device with at least one gate region and two junction regions;

forming a dielectric layer on the semiconductor device, wherein the dielectric layer is provided with a plurality of contact windows corresponding to the gate region and the two junction regions to expose a part of the gate region and the junction regions;

depositing a silicon layer or SiGe epitaxial layer in the plurality of contact windows to cover the exposed gate region and the exposed junction regions;

depositing a metal layer to cover the silicon layer or the SiGe epitaxial layer in the contact windows and the rest of the dielectric layer; and conducting a heat treatment of the semiconductor device in a nitrogen-containing environment, such that the silicon layer or the SiGe epitaxial layer and the metal layer are reacted, so as to convert the silicon layer or the SiGe epitaxial layer into a silicide.

2. The fabricating method according to claim 1, further comprising a step of forming a barrier layer on the metal layer.

3. The fabricating method according to claim 2, wherein the barrier layer is formed by nitridation.

4. The fabricating method according to claim 2, wherein the barrier layer is formed by reactive sputtering.

5. The fabricating method according to claim 2, further comprising a step of forming a plurality of metal plugs in the contact windows.

6. The fabricating method according to claim 1, wherein the silicon layer or the SiGe epitaxial layer is formed by selective epitaxial growth (SEG).

7. The fabricating method according to claim 1, wherein the metal layer is selected from the group consisting of Ti, Co, and Ni.

8. The fabricating method according to claim 1, wherein the step of conducting a heat treatment is achieved by a rapid thermal annealing process (RTP).

9. A method for fabricating a semiconductor device to lower source/drain sheet resistance, comprising:

providing a semiconductor device with at least one gate region and two junction regions;

depositing a silicon layer or SiGe epitaxial layer on the gate region and the two junction regions;

forming a dielectric layer on the semiconductor device, wherein the dielectric layer is provided with a plurality of contact windows corresponding to the gate region and the two junction regions, so as to expose a part of the silicon layer or SiGe epitaxial layer ob the gate region and the two junction regions;

depositing a metal layer to cover the exposed silicon layer or the exposed SiGe epitaxial layer in the contact windows and the rest of the dielectric layer; and conducting a heat treatment of the semiconductor device in a nitrogen-containing environment, such that the silicon layer or the SiGe epitaxial layer and the metal layer are reacted, so as to convert the silicon layer or the SiGe epitaxial layer into a silicide.

10. The fabricating method according to claim 9, further comprising a step of forming a barrier layer on the metal layer.

11. The fabricating method according to claim 10, wherein the barrier layer is formed by nitridation.

12. The fabricating method according to claim 10, wherein the barrier layer is formed by reactive sputtering.

13. The fabricating method according to claim 10, further comprising forming a plurality of metal plugs in the contact windows.

14. The fabricating method according to claim 9, wherein the silicon layer or the SiGe epitaxial layer is formed by SEG.

15. The fabricating method according to claim 9, wherein the metal layer is selected from the group consisting of Ti, Co, and Ni.

16. The fabricating method according to claim 9, wherein the step of conducting heat treatment is achieved by RTP.

* * * * *